US010816422B2

(12) United States Patent
Lin et al.

(10) Patent No.: US 10,816,422 B2
(45) Date of Patent: *Oct. 27, 2020

(54) PRESSURE SENSOR

(71) Applicant: InvenSense, Inc., San Jose, CA (US)

(72) Inventors: Chung-Hsien Lin, Hsinchu (TW); Rene Hummel, Baar (CH); Ulrich Bartsch, Meilen (CH); Marion Hermersdorf, Rodermark (DE); Tsung Lin Tang, Kaohsiung (TW); Wang Shen Su, Tainan (TW); Chia Min Lin, Hsinchu County (TW)

(73) Assignee: InvenSense, Inc., San Jose, CA (US)

( * ) Notice: Subject to any disclaimer, the term of this patent is extended or adjusted under 35 U.S.C. 154(b) by 517 days.

This patent is subject to a terminal disclaimer.

(21) Appl. No.: 15/442,468

(22) Filed: Feb. 24, 2017

(65) Prior Publication Data

US 2017/0167933 A1    Jun. 15, 2017

Related U.S. Application Data

(63) Continuation of application No. 14/522,014, filed on Oct. 23, 2014, now Pat. No. 9,581,512.

(30) Foreign Application Priority Data

Nov. 6, 2013    (EP) .................................... 13005236

(51) Int. Cl.
*G01L 9/00*    (2006.01)
*G01L 19/00*    (2006.01)
(Continued)

(52) U.S. Cl.
CPC ............ *G01L 9/0073* (2013.01); *B23P 19/04* (2013.01); *B81B 7/0051* (2013.01);
(Continued)

(58) Field of Classification Search
CPC ... G01L 19/147; G01L 9/0042; G01L 9/0072; G01L 13/025; G01L 19/04; G01L 9/0054;
(Continued)

(56) References Cited

U.S. PATENT DOCUMENTS 4,625,561 A    12/1986 Mikkor
4,730,496 A    3/1988 Knecht et al.
(Continued)

FOREIGN PATENT DOCUMENTS

CN    1440504 A    9/2003
CN    102169038 A    8/2011
(Continued)

OTHER PUBLICATIONS

Allan, Roger, "Ever-Shrinking Ics Turn to Exotic Packaging Methods," Jan. 15, 2009, Electronic Design, retrieved from http://electronicdesign.com/interconnects/ever-shrinking-ics-turn-exotic-packaging-methods. 4 pages.
(Continued)

*Primary Examiner* — Andre J Allen

(57) ABSTRACT

A pressure sensor comprises a first substrate and a cap attached to the first substrate. The cap includes a processing circuit, a cavity and a deformable membrane separating the cavity and a port open to an outside of the pressure sensor. Sensing means are provided for converting a response of the deformable membrane to pressure at the port into a signal capable of being processed by the processing circuit. The cap is attached to the first substrate such that the deformable membrane faces the first substrate and such that a gap is provided between the deformable membrane and the first substrate which gap contributes to the port. The first substrate comprises a support portion the cap is attached to, a contact portion for electrically connecting the pressure sensor to an external device, and one or more suspension (Continued)

elements for suspending the support portion from the contact portion.

20 Claims, 7 Drawing Sheets

(51) Int. Cl.
*G01L 19/14* (2006.01)
*B81B 7/00* (2006.01)
*B23P 19/04* (2006.01)
*G01L 9/12* (2006.01)

(52) U.S. Cl.
CPC .............. *B81B 7/0054* (2013.01); *G01L 9/12* (2013.01); *G01L 19/0084* (2013.01); *G01L 19/145* (2013.01); *G01L 19/146* (2013.01); *B81B 2201/0264* (2013.01); *B81B 2207/012* (2013.01); *B81B 2207/095* (2013.01); *B81C 2203/0792* (2013.01); *Y10T 29/49165* (2015.01); *Y10T 29/49904* (2015.01)

(58) Field of Classification Search
CPC .............. G01L 9/0075; G01L 19/0038; G01L 19/0084; G01L 19/14; G01L 19/0069; G01L 19/0618; G01L 19/0645; G01L 9/0055; G01L 9/0073; G01L 19/0092; G01L 19/143; G01L 9/0051; G01L 9/0052; G01L 11/025; G01L 19/0007; G01L 19/0046; G01L 19/06; G01L 19/0627; G01L 19/0681; G01L 9/00; G01L 9/0041; G01L 9/0044; G01L 11/04; G01L 19/0023; G01L 19/0672; G01L 19/069; G01L 19/142; G01L 19/16; G01L 27/002; G01L 7/00; G01L 7/163; G01L 7/166; G01L 9/0047; G01L 11/02; G01L 13/00; G01L 15/00; G01L 19/0609; G01L 19/083; G01L 19/10; G01L 19/148; G01L 7/08; G01L 9/0045; G01L 9/0048; G01L 9/006; G01L 9/007; G01L 9/0076; G01L 9/045; G01L 9/06; G01L 9/065; G01L 9/12; G01L 9/125; G01L 11/00; G01L 17/00; G01L 19/00; G01L 19/0015; G01L 19/003; G01L 19/0076; G01L 19/02; G01L 19/08; G01L 19/141; G01L 19/145; G01L 19/146; G01L 1/142; G01L 1/2262; G01L 1/246; G01L 21/12; G01L 23/16; G01L 27/005; G01L 27/007; G01L 7/04; G01L 7/063; G01L 7/082; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/04; G01L 9/08; G01L 9/085; G01L 9/105; G01L 9/14; G01L 9/16
USPC .................................................. 73/700–756
See application file for complete search history.

(56) References Cited

U.S. PATENT DOCUMENTS

| | | |
|---|---|---|
| 4,769,738 A | 9/1988 | Nakamura et al. |
| 4,949,581 A | 8/1990 | Rud, Jr. |
| 4,975,390 A | 12/1990 | Fujii et al. |
| 5,062,302 A | 11/1991 | Petersen et al. |
| 5,113,868 A | 5/1992 | Wise et al. |
| 5,155,061 A | 10/1992 | O'Connor et al. |
| 5,277,068 A | 1/1994 | Fukiura et al. |
| 5,332,469 A | 7/1994 | Mastrangelo |
| 5,334,569 A | 8/1994 | Kisalus |
| 5,335,550 A | 8/1994 | Satou |
| 5,343,064 A | 8/1994 | Spangler et al. |
| 5,344,523 A | 9/1994 | Fung et al. |
| 5,407,501 A | 4/1995 | Koen et al. |
| 5,470,797 A | 11/1995 | Mastrangelo |
| 5,525,280 A | 6/1996 | Shukla et al. |
| 5,557,972 A | 9/1996 | Jacobs et al. |
| 5,576,251 A | 11/1996 | Garabedian et al. |
| 5,578,843 A | 11/1996 | Garabedian et al. |
| 5,683,594 A | 11/1997 | Hocker et al. |
| 5,929,498 A | 7/1999 | Ismail et al. |
| 5,936,164 A | 8/1999 | Sparks et al. |
| 6,038,928 A | 3/2000 | Maluf et al. |
| 6,074,890 A | 6/2000 | Yao et al. |
| 6,140,144 A | 10/2000 | Najafi et al. |
| 6,143,583 A | 11/2000 | Hays |
| 6,208,019 B1 | 3/2001 | Tane et al. |
| 6,346,742 B1 | 2/2002 | Bryzek et al. |
| 6,395,585 B2 | 5/2002 | Brandl |
| 6,433,427 B1 | 8/2002 | Wu et al. |
| 6,441,451 B1 | 8/2002 | Ikeda et al. |
| 6,458,622 B1 | 10/2002 | Keser et al. |
| 6,465,271 B1 | 10/2002 | Ko et al. |
| 6,499,354 B1 | 12/2002 | Najafi et al. |
| 6,520,014 B1 | 2/2003 | Brandl |
| 6,533,554 B1 | 3/2003 | Vargo et al. |
| 6,552,404 B1 | 4/2003 | Hynes et al. |
| 6,556,418 B2 | 4/2003 | Aigner et al. |
| 6,568,274 B1 * | 5/2003 | Lucas ................... G01L 9/0072 73/718 |
| 6,584,854 B2 | 7/2003 | Kimura et al. |
| 6,700,174 B1 | 3/2004 | Miu et al. |
| 6,713,828 B1 | 3/2004 | Chavan et al. |
| 6,743,656 B2 | 6/2004 | Orcutt et al. |
| 6,777,263 B1 | 8/2004 | Gan et al. |
| 6,962,867 B2 | 11/2005 | Jackson et al. |
| 6,973,835 B2 | 12/2005 | Rangsten et al. |
| 7,015,060 B1 | 3/2006 | Kubena et al. |
| 7,122,458 B2 | 10/2006 | Cheng et al. |
| 7,246,525 B2 | 7/2007 | Birkelund et al. |
| 7,273,763 B1 | 9/2007 | Neumeier et al. |
| 7,468,552 B2 | 12/2008 | Ohta |
| 7,482,193 B2 | 1/2009 | DCamp et al. |
| 7,539,003 B2 | 5/2009 | Ray et al. |
| 7,704,774 B2 | 4/2010 | Mayer et al. |
| 8,008,738 B2 | 8/2011 | Villa et al. |
| 8,049,287 B2 | 11/2011 | Combi et al. |
| 8,304,919 B2 | 11/2012 | Pendse et al. |
| 8,536,663 B1 | 9/2013 | Kuo et al. |
| 8,567,256 B2 | 10/2013 | Albicker et al. |
| 8,704,318 B2 | 4/2014 | Zhou |
| 9,330,929 B1 | 5/2016 | Kautzsch et al. |
| 9,581,512 B2 * | 2/2017 | Lin ......................... B23P 19/04 |
| 9,783,411 B1 * | 10/2017 | Potasek ................ G01L 9/0047 |
| 2001/0023087 A1 | 9/2001 | Brandl |
| 2002/0048839 A1 | 4/2002 | Miller et al. |
| 2002/0185737 A1 | 12/2002 | Regan et al. |
| 2003/0019299 A1 * | 1/2003 | Horie ................... G01L 9/0073 73/718 |
| 2003/0056598 A1 | 3/2003 | Kimura et al. |
| 2003/0093895 A1 | 5/2003 | Miyazaki et al. |
| 2003/0107868 A1 * | 6/2003 | Chatzandroulis ....... G01L 1/148 361/303 |
| 2003/0143775 A1 | 7/2003 | Brady |
| 2003/0154796 A1 | 8/2003 | Ishio et al. |
| 2004/0171195 A1 | 9/2004 | Raben |
| 2005/0016289 A1 | 1/2005 | Saito et al. |
| 2005/0124159 A1 | 6/2005 | Kalvesten et al. |
| 2005/0156320 A1 | 7/2005 | Mastromatteo |
| 2005/0229711 A1 | 10/2005 | Ohms et al. |
| 2006/0014358 A1 | 1/2006 | Sawyer et al. |
| 2006/0027522 A1 | 2/2006 | Martin et al. |
| 2006/0032039 A1 | 2/2006 | Rangsten et al. |

(56) References Cited

U.S. PATENT DOCUMENTS

| | | |
|---|---|---|
| 2006/0063354 A1 | 3/2006 | Fortin et al. |
| 2006/0097331 A1 | 5/2006 | Hattori et al. |
| 2006/0169049 A1 | 8/2006 | Matsubara |
| 2006/0243054 A1 | 11/2006 | Saito et al. |
| 2007/0019101 A1 | 1/2007 | Minamio et al. |
| 2007/0141808 A1 | 6/2007 | Fortin et al. |
| 2007/0275495 A1 | 11/2007 | Meyer et al. |
| 2008/0016683 A1 | 1/2008 | Brida et al. |
| 2008/0036082 A1 | 2/2008 | Eun |
| 2008/0061412 A1 | 3/2008 | Shen et al. |
| 2008/0236292 A1 | 10/2008 | Reijs |
| 2008/0251705 A1 | 10/2008 | Tseng |
| 2009/0166827 A1 | 7/2009 | Foster et al. |
| 2009/0322929 A1 | 12/2009 | Webster |
| 2010/0055821 A1 | 3/2010 | Buhler et al. |
| 2010/0109140 A1 | 5/2010 | Oh et al. |
| 2010/0139409 A1 | 6/2010 | Mischke et al. |
| 2010/0171153 A1 | 7/2010 | Yang |
| 2010/0207217 A1 | 8/2010 | Zuniga-Ortiz et al. |
| 2010/0242605 A1 | 9/2010 | Offterdinger |
| 2011/0027930 A1 | 2/2011 | El-Gamal et al. |
| 2011/0108932 A1* | 5/2011 | Benzel ............... G01L 9/0073 257/415 |
| 2011/0154905 A1* | 6/2011 | Hsu ................... G01L 9/0073 73/724 |
| 2011/0230068 A1 | 9/2011 | Pahl |
| 2012/0024075 A1* | 2/2012 | Peng ................... G01L 9/0073 73/724 |
| 2012/0037935 A1 | 2/2012 | Yang |
| 2012/0037953 A1 | 2/2012 | Hayano |
| 2013/0093030 A1 | 4/2013 | Isebrand et al. |
| 2013/0127000 A1 | 5/2013 | Oganesian |
| 2013/0181314 A1 | 7/2013 | Ryu et al. |
| 2013/0264755 A1 | 10/2013 | Eskridge |
| 2013/0276544 A1 | 10/2013 | Potasek et al. |
| 2014/0151822 A1* | 6/2014 | Graham ............... G01L 9/0047 257/415 |
| 2015/0040675 A1 | 2/2015 | Ding |
| 2015/0048461 A1 | 2/2015 | Mayer |
| 2015/0061049 A1* | 3/2015 | Weber ................. G01L 1/148 257/417 |
| 2015/0122038 A1* | 5/2015 | Mayer ................. G01L 7/024 73/715 |
| 2015/0122041 A1* | 5/2015 | Lin ..................... B23P 19/04 73/724 |
| 2015/0122042 A1 | 5/2015 | Lin et al. |
| 2015/0260593 A1 | 9/2015 | Hsu et al. |
| 2015/0268115 A1 | 9/2015 | Robert et al. |
| 2015/0270180 A1 | 9/2015 | Yang |
| 2016/0025583 A1 | 1/2016 | Besling et al. |
| 2016/0290883 A1* | 10/2016 | Schumm .............. B81C 1/00285 |
| 2017/0122825 A1* | 5/2017 | Naumann ............ G01L 9/0072 |
| 2017/0210618 A1* | 7/2017 | Chang ................. B81C 1/00158 |

FOREIGN PATENT DOCUMENTS

| | | |
|---|---|---|
| DE | 10027234 A1 | 12/2000 |
| DE | 19929025 A1 | 12/2000 |
| DE | 10201054 A1 | 1/2003 |
| DE | 10-2005-008959 A1 | 9/2006 |
| DE | 10-2009-046692 A1 | 5/2011 |
| DE | 10-2010-001073 A1 | 7/2011 |
| EP | 0155517 A2 | 9/1985 |
| EP | 0596711 A2 | 5/1994 |
| EP | 0633459 A2 | 1/1995 |
| EP | 0992778 A2 | 4/2000 |
| EP | 0993778 A1 | 4/2000 |
| EP | 1555517 A2 | 7/2005 |
| EP | 1860417 A2 | 11/2007 |
| EP | 2075221 A2 | 7/2009 |
| EP | 2135839 A2 | 12/2009 |
| EP | 2246292 A2 | 11/2010 |
| EP | 2421037 A1 | 2/2012 |
| EP | 2647594 A2 | 10/2013 |
| EP | 2653443 A2 | 10/2013 |
| EP | 2790214 A1 | 10/2014 |
| EP | 2871455 A1 | 5/2015 |
| JP | 2729005 B2 | 12/1997 |
| JP | 2007-057238 A | 3/2007 |
| WO | 00/036387 A1 | 6/2000 |
| WO | 2003/006387 A2 | 1/2003 |
| WO | 2003/034016 A1 | 4/2003 |
| WO | 03/036387 A2 | 5/2003 |
| WO | 2004/106879 A1 | 12/2004 |
| WO | 2007/117198 A1 | 10/2007 |

OTHER PUBLICATIONS

Allan, Roger, "MEMS Inertial Sensors Push Size, Performance Limits for Next-Gen Mobile Devices,"Apr. 14, 2010, Electronic Design, retrieved from http://electronicdesign.com/components/mems-inertial-sensors-push-size-performance-limits-next-gen-mobile-devices. 6 pages.

Allan, Roger, Figure 2 in "Ever-Shrinking ICs Turn to Exotic Packaging Methods," Jan. 15, 2009, Electronic Design, retrieved from http://electronicdesign.com/site-files/electronicdesign.com/files/archive/electronicdesign.com/files/29/20374/fig_02.gif. 1 page.

Allan, Roger, Figure 8 in "MEMS Inertial Sensors Push Size, Performance Limits for Next-Gen Mobile Devices," Apr. 14, 2010, Electronic Design, retrieved from http://electronicdesign.com/site-files/electronicdesign.com/files/archive/electronicdesign.com/Content/14978/60071_fig_08.jpg. 1 page.

Baltes et al., "CMOS-based Microsensors and Packaging," Sensors and Actuators, vol. 92, No. 1-3, pp. 1-9, Aug. 1, 2001. 9 pages.

EP Extended Search Report dated Apr. 3, 2013 in EP Application No. 12007333.3. 6 pages.

EP Extended Search Report dated Apr. 28, 2014 in EP Application No. 13005236.8. 11 pages.

EP Extended Search Report dated Dec. 9, 2010 in EP Application No. 10009453.1. 7 pages.

EP Extended Search Report dated May 31, 2016 in EP Application No. 13005235.0. 11 pages.

EP Extended Search Report dated Nov. 20, 2015 in EP Application No. 15173033.0. 10 pages.

EP Extended Search Report dated Oct. 2, 2015 in EP Application No. 15000967.8. 6 pages.

EP Extended Search Report dated Oct. 20, 2009 in EP Application No. 07008470.2. 18 pages.

EP Extended Search Report dated Oct. 11, 2006 in EP Application No. 06010606.9. 10 pages.

Kiihamaki et al., "Integrated Pressure Sensors on SOI," Micro Structure Workshop, 2004. 4 pages.

Klaassen et al., "Silicon Fusion Bonding and Deep Reactive Ion Etching; A New Technology From Microstructures," The 8th International Conference on Solid-State Sensors and Actuators and Eurosensors IX, Stockholm, Sweden, Jun. 25-29, 1995. 4 pages.

Petersen et al., "Silicon Fusion Bonding for Pressure Sensors," NovaSensor; TH215-4/88/0000-01444, pp. 144-147. 4 pages.

Wikipedia, "Silicon on Insulator," Oct. 17, 2013, pp. 1-5. 5 pages.

EP Extended Search Report dated Apr. 25, 2014 in EP Application No. 13005235.0. 9 pages.

\* cited by examiner

PRESSURE SENSOR

CROSS REFERENCES TO RELATED APPLICATIONS

This application is a continuation application and claims the benefit and priority to the U.S. patent application Ser. No. 14/522,014, which was filed on Oct. 23, 2014, which claims the priority and benefit to the European patent application 13005236.8, filed Nov. 6, 2013, the disclosures of which are incorporated herein by reference in their entirety.

BACKGROUND

Pressure sensors and methods of manufacturing pressure sensors are known. In the U.S. Pat. No. 7,704,774 B2 for example, there is described a pressure sensor, which is manufactured by joining two substrates, the first substrate comprising CMOS circuitry and the second being an SOI substrate. A cavity is formed in a top material layer of the first substrate, which is covered by the silicon layer of the second substrate. Part or all of the substrate of the second wafer is removed to form a membrane from the silicon layer. Alternatively it is further described that the cavity can be formed in the second substrate. The second substrate is electrically connected to the circuitry on the first substrate. The known design allows for the use of standard CMOS processes for integrating circuitry on the first substrate.

In pressure sensors the membrane may be sensitive to stress. When a pressure sensor is mounted to a carrier and is electrically connected thereto mechanical stress may be evoked and transmitted via solder balls to the first substrate and specifically to stress sensitive structures of the pressure sensor such as the membrane.

SUMMARY

Hence, according to a first aspect of the embodiment, there is provided a pressure sensor, particularly an absolute pressure sensor, with a deformable membrane providing a separation between a cavity within the case of an absolute pressure sensor an essentially constant pressure and a port open to the outside of the sensor. The cavity is formed in a cap which cap is attached to a first substrate such that the deformable membrane faces the first substrate and such that a gap is provided between the deformable membrane and the first substrate. The cap further contains a processing circuit. A deformation of the deformable membrane is converted by suitable sensing means into a signal that is supplied to and processed by the processing circuit in the cap.

The first substrate contains a support portion to which the cap is attached. A contact portion of the first substrate is provided for electrically connecting the pressure sensor to the outside world. The support portion is suspended from the contact portion by one or more suspension elements.

In this arrangement, the deformable membrane as element sensitive to stress in essence is mechanically decoupled from the contact portion of the first substrate via which stress may be induced from an external carrier, or during mounting of the pressure sensor to an external carrier given that the contact portion may be the only portion via which the pressure sensor is electrically and mechanically connected to e.g. an external carrier which may be an example of an external device. Not only is the deformable membrane no longer attached to the first substrate and is integrated into the cap instead. Moreover, already a first substrate portion, i.e. the support portion is mechanically decoupled from the contact portion. On the other hand, the cap is attached, and is solely attached to the support portion of the first substrate but not to the contact portion such that the membrane has no direct mechanical link to the contact portion of the first substrate. Hence, any propagation of stress induced via the contact portion of the first substrate towards the membrane is significantly reduced.

The cap is arranged such that the deformable membrane faces the first substrate, and may face a front side of the first substrate. A gap is provided between the deformable membrane and the front side of the first substrate in order to allow a deflection of the membrane in a direction orthogonal to the plane of the cap. In such arrangement, the deformable membrane is protected given that it does not directly face the environment of the sensor.

In an embodiment, the cap is at least partly manufactured from a second substrate. The second substrate is a semiconductor substrate, such as a silicon substrate. Hence, the second substrate may, for example, contain a bulk material made from silicon and various layers stacked on the bulk material such as one or more of metal layers, insulation layers and passivation layers. The processing circuit may be integrated into the second substrate. The cavity may be formed solely in the layer stack of the second substrate and does not reach into the bulk material.

In one embodiment, the deformable membrane is built from a third substrate, which is attached to the top layer of the second substrate. The third substrate may, for example, be an SOI (Silicon On Insulator) substrate, wherein specifically the deformable membrane may be built from a silicon layer of the SOI substrate while an insulation layer and bulk material of the SOI substrate are removed during processing.

In the first substrate, the contact and the support portion are built by applying one or more grooves vertically through the first substrate. By way of manufacturing the one or more grooves, one or more small portions of the first substrate remain for mechanically linking the support portion to the contact portion. This/these small portion/s act as suspension element/s for suspending the support portion from the contact portion. The one or more grooves are arranged vertically in the first substrate, i.e. orthogonal to a plane extension of the first substrate. The suspension element/s may contain ridges, e.g. four ridges that hold the support portion. Each suspension element may be formed integrally with the support portion and the contact portion given that in one embodiment the support portion, the contact portion and the one or more suspension elements are built from the first substrate. In one embodiment, the suspension elements do not represent the shortest path between the contact portion and the support portion but do have a shape that allows one or more of a deflection or a rotation of the support portion relative to the contact portion, e.g. a deflection in at least one direction of the plane of the first substrate. In such way, translational and/or rotational forces applied to the support portion via the cap may be dampened without damaging the suspension elements. The suspension elements may contain spring portions for this purpose.

The one or more suspension elements may act as components of reduced stiffness for reducing stress that otherwise migrates to the cap. The one or more grooves to a large extent decouple the cap from the contact portion of the first substrate and may surround the contact portion except for the one or more suspension elements. Summarizing, the stress sensitive deformable membrane is mechanically decoupled from the contact portion of the first substrate which is the component accepting stress when being mounted to a carrier.

The sensing means may in one embodiment contain the deformable membrane itself serving as first electrode and as such containing electrically conducting material. On the other hand, a second electrode may be arranged near or in the cavity at a stationary position such that this electrode arrangement may allow sensing a capacitance between the second electrode and the deflectable membrane which capacitance is dependent on the distance between the electrodes. For example, in case a medium such as a gas is applied to the cavity at a defined pressure and a deflection of the membrane is evoked, a distance between the electrodes may change and result in a change of the capacitance. In one embodiment, the second electrode may be a metal layer, or in another embodiment, may be a polysilicon layer.

In one embodiment, the electrodes are electrically connected to the processing circuit integrated in the second substrate.

For electrically connecting the cap to the first substrate, electrical connections may be provided between the cap and the first substrate, e.g. in form of solder bumps or balls, or other electrically conducting elements that at the same time may also serve as spacer elements for providing the gap between the first substrate and the deformable membrane. In order to connect to the electrically conducting layers in the second substrate, contact windows may be provided into the second substrate and if applicable through the third substrate. On the other hand, the spacer elements may connect to contact pads on the first substrate which may be areas of conducting layers revealed from the first substrate.

According to another aspect of the present embodiment which aspect is independent from the embodiments relating to a pressure sensor, a sensor is provided comprising a first substrate, a cap attached to the first substrate wherein the cap includes a processing circuit and a sensitive element for converting a measure to be sensed into a signal capable of being processed by the processing circuit.

The first substrate comprises a support portion the cap is attached to, a contact portion for electrically connecting the sensor to an external device, and one or more suspension elements for suspending the support portion from the contact portion.

In one embodiment, the cap is attached to the first substrate such that the sensitive element faces the first substrate and such that a gap is provided between the sensitive element and the first substrate.

According to another aspect of the present embodiment, a method is provided for manufacturing a pressure sensor. A first substrate is provided, as well as a second substrate and a third substrate. In the second substrate, a processing circuit is integrated and a cavity is manufactured, e.g. by etching. In another embodiment, the second substrate may be prefabricated with the processing circuit and/or the cavity. In the following, the third substrate is mounted to the second substrate thereby covering the cavity in the second substrate to build a deformable membrane for sensing a pressure applied thereto.

In the following, an assembly of the second substrate and the third substrate is mounted to a support portion of the first substrate with the deformable membrane facing the first substrate. Spacer elements may be provided for mounting the deformable membrane distant from a surface of the first substrate in order to provide a gap between the deformable membrane and the first substrate.

One or more grooves are manufactured into the first substrate around a contact portion which serves for electrically connecting the pressure sensor to an external device. As a result of manufacturing the one or more grooves, the support portion suspends from the contact portion by means of suspension elements.

The manufacturing of the one or more grooves may be performed in different ways: The first substrate may be preprocessed prior to being attached to the assembly of the second and the third substrate by etching trenches from e.g. a front side of the first substrate therein. It is assumed that the first substrate is thin enough and an etching process is applied that allows etching trenches in the first substrate that reach through the first substrate.

In an alternate embodiment, the trenches may not be manufactured at a sufficient depth for reaching through the entire bulk material of the first substrate. Hence, there may be another processing step required to open the trenches from the backside of the first substrate, i.e. opposite to the front side that faces the deformable membrane. In this embodiment, the trenches are manufactured prior to assembling the first substrate and the assembly of the second and third substrate while the trenches are laid open from the backside of the first substrate after having attached the assembly to the first substrate.

In one embodiment, the bulk material of the first substrate is first thinned all across the first substrate in order to enable an etching through the entire first substrate in one go, or to facilitate an opening of previously etched trenches from the backside.

In the first substrate, electrically conducting vias may be built for electrically connecting the cap and specifically its processing circuit to electrical contacts at the backside of the first substrate. The vias may be built in the first substrate after having mounted the assembly of the second substrate and the third substrate to the first substrate and prior to opening the trenches in the first substrate if required. In one embodiment, the one or more vias are made using a TSV (Through Silicon Via) process. Prior to e.g. etching the holes for the vias into the first substrate, a thickness of the first substrate may be reduced, e.g. down to 150 µm (micron) or less rendering it more suitable for TSV or similar processes. When reducing the thickness of the first substrate the second substrate may protect the deformable membrane and other sensitive structures.

In case the second substrate contains a bulk material such as silicon and layers stacked onto the bulk material, the cavity may only extend into one or more of the layers but not into the bulk material.

In one embodiment, the third substrate includes an SOI (Silicon On Insulator) substrate. The third substrate may be attached to a top layer of the second substrate. Then, bulk material of the SOI substrate and its insulating layer may be removed thereby leaving a silicon layer as deformable membrane spanning the cavity in the second substrate.

In one embodiment, following the previous step of applying the third substrate to the second substrate, one or more contact windows are etched through the third substrate outside the area of the deformable membrane, and may be etched into at least some of the layers of the second substrate in order to provide access to electrically conducting layers therein. These electrically conducting layers in turn may be connected to the electrodes on the one hand, and to the processing circuit on the other hand. The contact windows may be metalized in a next step.

A total height of the pressure sensor stack may be between 350 to 500 microns.

It one embodiment the processing circuit is fabricated in the second substrate by a CMOS process following well-known steps.

In one embodiment, the method is executed on a wafer scale, i.e. multiple pressure sensors are manufactured in the same manufacturing steps on the same wafer. At one point in time, e.g. at the very end, the individual pressure sensors are separated from each other by dicing the wafer stack. Prior to the separation step, a second wafer is provided with multiple processing circuits being preprocessed thereon, as well as a first and a third wafer corresponding to the first and third substrate. The processing circuits and the cavities are manufactured in the second wafer, and the second wafer prepared in this manner is attached to the third wafer for processing the deformable membranes. The assembly of the second and the third wafer may then be mounted to the first wafer with the deformable membranes facing the first wafer. The first wafer may be preprocessed with trenches reaching into or through the first wafer. Returning to the assembled first, second and third wafers, the first wafer may then continue to be processed from its backside, e.g. by manufacturing vias. In one embodiment, if the trenches prepared in the first substrate do not reach through it, the laying open of the trenches is performed from the backside of the substrate after having manufactured the vias, however, still on wafer-scale. At the very end, the wafer stack may be separated into individual pressure sensor chips.

According to another aspect of the present embodiment which aspect is independent from the embodiments relating to the manufacturing of a pressure sensor, a method for manufacturing a sensor is provided, comprising the steps of providing a first substrate, providing a second substrate and mounting the second substrate to a support portion of the first substrate. Grooves are manufactured into the first substrate around a contact portion for electrically connecting the pressure sensor to an external device, thereby making the support portion suspend from the contact portion by means of suspension elements.

In one embodiment, a sensitive element is arranged at the second substrate with the sensitive element facing the first substrate. A gap may be provided between the sensitive element and the first substrate.

The described embodiments similarly pertain to the sensor and the method. Synergetic effects may arise from different combinations of the embodiments although they might not be described in detail.

The order of method steps is as listed in the claims are not limited thereto and a different order shall be encompassed by the subject method claims, too, where technically applicable.

Other advantageous embodiments are listed in the dependent claims as well as in the description below.

BRIEF DESCRIPTION OF THE DRAWINGS

Embodiments and advantages will become apparent from the following detailed description thereof. Such description makes reference to the annexed drawings, wherein the figures show.

DETAILED DESCRIPTION

Figure 1:
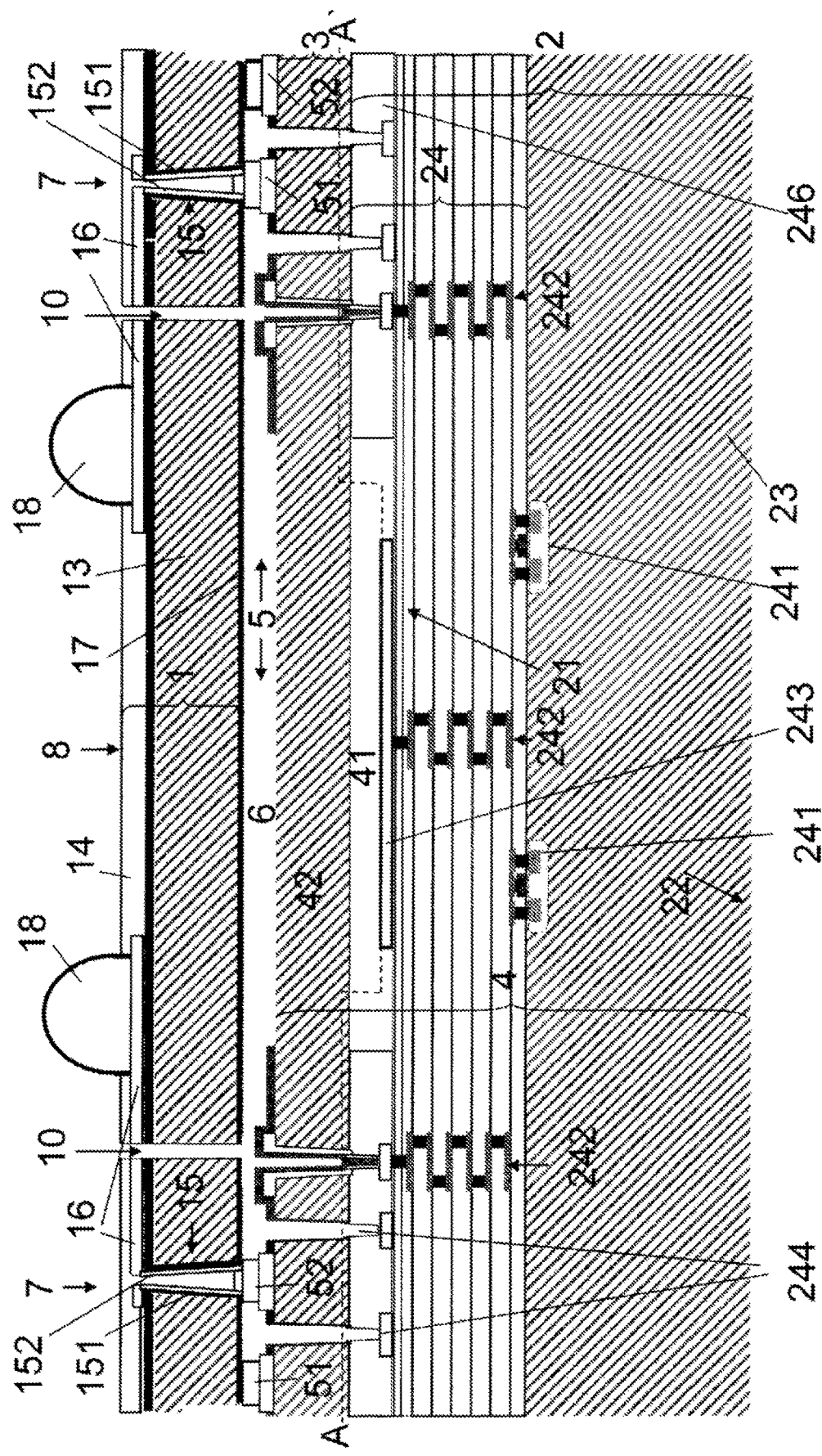
FIG. 1 in a) a schematic sectional view, in b) a representative horizontal cut, and in c) a representative bottom view of a pressure sensor in accordance with an example of the embodiment.
Figure 1:
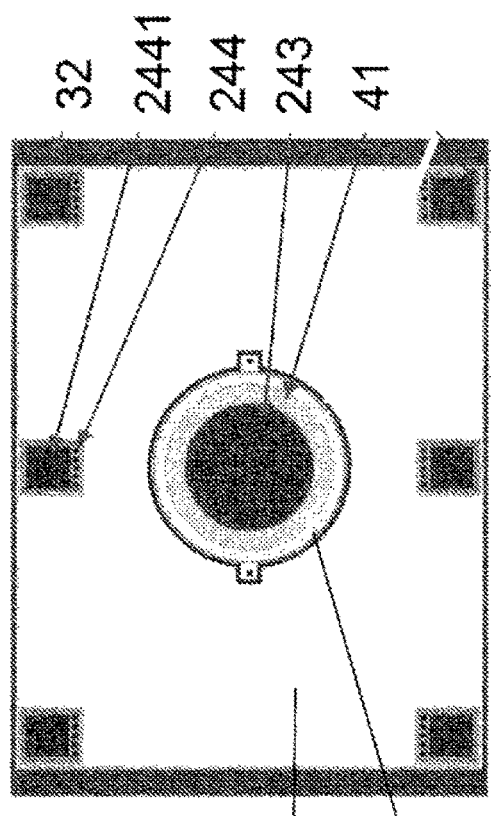
Figure 1:
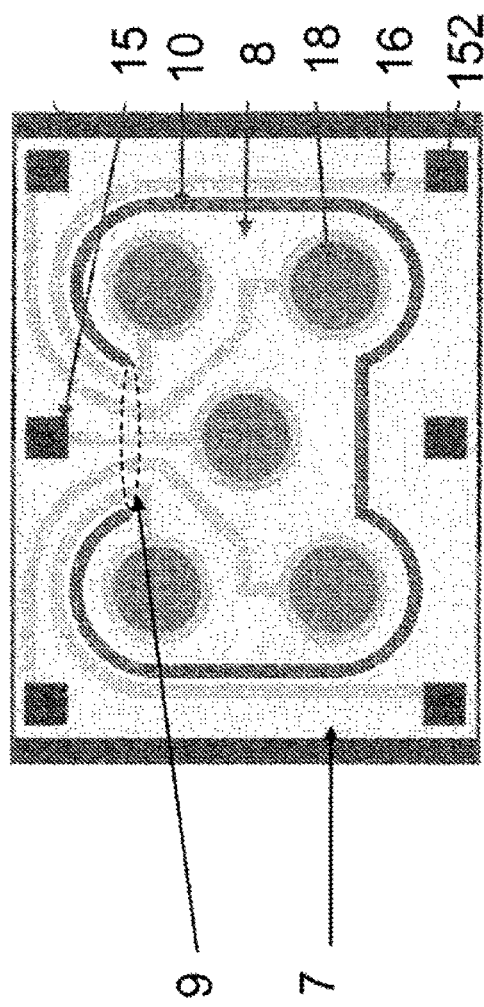

The term "pressure sensor" as used herein designates any type of sensor measuring a parameter that is equal to or derived from the pressure of a fluid. In particular, the term designates relative (i.e. differential) as well as absolute pressure sensors, it also covers static as well as dynamic pressure sensors. Typical examples of applications of such sensors are e.g. in scientific instrumentation, meteorology, altitude measurement, sound recording, mobile or portable computers and phones etc.

FIG. 1a) shows a schematic sectional view of a pressure sensor in accordance with an embodiment. The pressure sensor as shown is flipped with its solder balls 18 showing upwards while the pressure sensor will be mounted to a carrier with its solder balls sitting on the carrier.

The pressure sensor includes a first substrate 1 and a cap 4 for the first substrate 1.

The cap 4 may be made from a second substrate 2 and a third substrate 3. The second substrate 2 may be a semiconductor substrate, e.g., a silicon substrate, and has a front side 21 and a backside 22. The second substrate 2 contains a bulk material 23 of, e.g. silicon and a stack of layers 24 on the bulk material 23. These layers 24 may be arranged for CMOS processing of the second substrate 2, and as such may also be denoted as CMOS layers or material layers. Specifically, the layers 24 can include for example a plurality of SiO2 layers, metal or polysilicon layers. The bulk material 23 may contain doped regions within the silicon such as indicated by the reference sign 241. These components can form active circuitry, such as amplifiers, A/D converters or other analog and/or digital signal processing units. A top layer 246 of the stack of layers 24 may be a dielectric layer of silicon oxide and/or silicon nitride protecting the structures below it. In the present example, it is assumed that a processing circuit collectively referred to as 241 is integrated on the front side 21 of the second substrate 2 by means of CMOS processing.

In the cap 4, a cavity 41 is formed by omitting or removing material from one or more of the layers 24, presently the top layer 246. The cavity 41 is closed by a deformable membrane 42. The membrane 42 is sufficiently thin such that it deforms depending on a pressure drop between a pressure at the top of the membrane 42 and below it. A metal layer 243 may be used as an electrode, and as such may be arranged at the bottom of the cavity 41.

The membrane 42 may be formed by a doped, conducting silicon layer, is arranged as a sealing lid over the cavity 41, and may be used as another electrode for which reason the deformable membrane 42 may contain electrically conducting material. Hence upon a change in pressure the membrane 42 deflects and as such a distance between the two electrodes changes which results in a change of the capacitance between the two electrodes.

In the present example, the deformable membrane 42 is built from a third substrate 3. The third substrate 3 as shown in FIG. 1 may be the remainder of an SOI substrate, specifically its device layer after some manufacturing steps. The third substrate 3 not only may contribute to the deformable membrane 42. The third substrate 3 may contain contact windows 244 reaching through which may also reach into one or more of the layers 24.

Corresponding signals may be transmitted from the electrodes, i.e. the deformable membrane 42 and the metal layer 243 via electrical paths 242 to the processing circuit 241 where these signals are processed. Signals processed by the processing circuit 241 may be supplied to the first substrate 1.

The first substrate 1 may be a semiconductor substrate, e.g. a silicon substrate, or a glass substrate, for example, with a front side 11 and a back side 12. The semiconductor substrate 1 includes bulk material 13 such as silicon, and one or more layers 14, such as an oxide layer on the bulk material 13. The one or more layers 14 may further include for example a plurality of SiO2 layers, metal or polysilicon layers.

The first substrate 1 contains vias 15 reaching vertically through the first substrate 1. Those vias 15 provide for an electrical connection from the front side 11 of the substrate 1 to its backside 12. Those vias 15 are manufactured by etching or drilling holes into the first substrate 1 from its backside 12, by applying an oxide 151 to the hole, and by applying conducting material 152 to the oxide 151. At the back side 12 of the first substrate 1, the vias 15 are electrically connected to contact pads 16 residing on an oxide layer 17 applied to the bulk material 13, which contact pads 16 serve as support for solder balls 18 or other contact means for electrically connecting the pressure sensor to the outside world, i.e. to another device. Alternative to the vias 15 and the solder balls 18, there may be other ways of interconnecting the pressure sensor to the outside world, e.g. by means of wire bonds, bond pads or conducting structures that lead from the front side 11 of the first substrate 1 along its sides to the backside 12. The electrical connection to the outside world may also be implemented via one or more of a Land Grid Array, a Pin Grid Array, or a leadframe.

The assembly containing the second and the third substrate 2,3 is attached to the front side 11 of the first substrate 1. The attachment may include bonding or other fusion techniques. In the present example, spacer elements 5 are provided between the third substrate 3 and the first substrate 1. The spacer elements 5 may have different functions: On the one hand, the spacer elements 5 provide for a gap 6 between the deformable membrane 42 and the first substrate 1 which is required for supplying the pressure medium to the membrane 42. On the other hand, some of the spacer elements 5, but not necessarily all may be electrically conductive for connecting the contact windows 244 to the first substrate 1. Other or the same spacer elements 5 may provide mechanical stability for the stacking of substrates 1,3, and/or may provide mechanical protection to the inside of the pressure sensor, and specifically to the membrane 42. For this purpose, a spacer element 51 is arranged in from of a ring at the edges of the substrates 1,3 providing mechanical stability, protection as well as an electrical connection, while spacer elements 52 are rather pillar-like and provide electrical connections.

The signals provided by the processing circuit 241 hence may be transferred via one or more of the electrical paths 242 and via one or more of the contact windows 244 to one or more of the spacer elements 5. As shown in FIG. 1, the spacer elements 52 end at the vias 15 of the first substrate 1 and are electrically connected thereto. Hence, the signals are conducted through the vias 15 to the contact pads 16 and the solder balls 18.

The first substrate 1 contains a support portion 7 and a contact portion 8. Suspension elements not shown in the present illustration are provided for suspending the support portion 7 from the contact portion 8. The support portion 7 may encircle the contact portion 8 in a plane of the first substrate 1.

The contact portion 8 is separated from the support portion 7 by one or more grooves 10. Owed to the manufacturing of the contact portion 8 and the support portion 7 from the common first substrate 1, both portions may include bulk material 13 from the first substrate 1.

The cap 4 may be exclusively attached to the support portion 7 of the first substrate 1 via the spacer elements 5. On the other hand, it may be the solely contact portion that provides a mechanical and electrical contact to the outside world. Hence, the portion of the pressure sensor via which mechanical stress is induced, i.e. the contact portion 8 is mechanically decoupled from the rest of the pressure sensor and specifically from the deformable membrane 42 by way of the suspension elements.

A port for conducting a medium to the deformable membrane 42 in the present example encompasses the grooves 10 and the gap 6, or at least parts of.

The overall height of the pressure sensor in the present example is about 400 μm. FIG. 1b) illustrates a representative horizontal cut of a pressure sensor, e.g. according to line A-A' in FIG. 1a) not necessarily matching all elements as provided in FIG. 1a). A mechanical support 32 holds the third substrate 3. In the third substrate 3, a plurality of contact windows 244 are provided which contain electrically conducting material 2441 in their interior. The third substrate 3 also builds the deformable membrane 42. Then, the horizontal cut switches to a different plane, i.e. the plane of the electrode 243. This electrode 243 is surrounded by the cavity 41.

FIG. 1e) illustrates a bottom view onto the first substrate 1 of the pressure sensor. The first substrate 1 contains a support portion 7 and a contact portion 8 wherein the support portion 7 is suspended from the contact portion 8 by means of a suspension element 9, which is a representation of a mechanical link between the two portions 7 and 8. A groove 10 is arranged vertically through the first substrate 1. Vias 15 are arranged in the support portion 7, while the solder balls 18 are arranged in the contact portion 8. The contact portion 8 is electrically connected to the support portion 7 by means of electrically conducting structures such as the contact pads 16 which electrically conducting structures may in general be denoted as redistribution layer.

Figure 2:
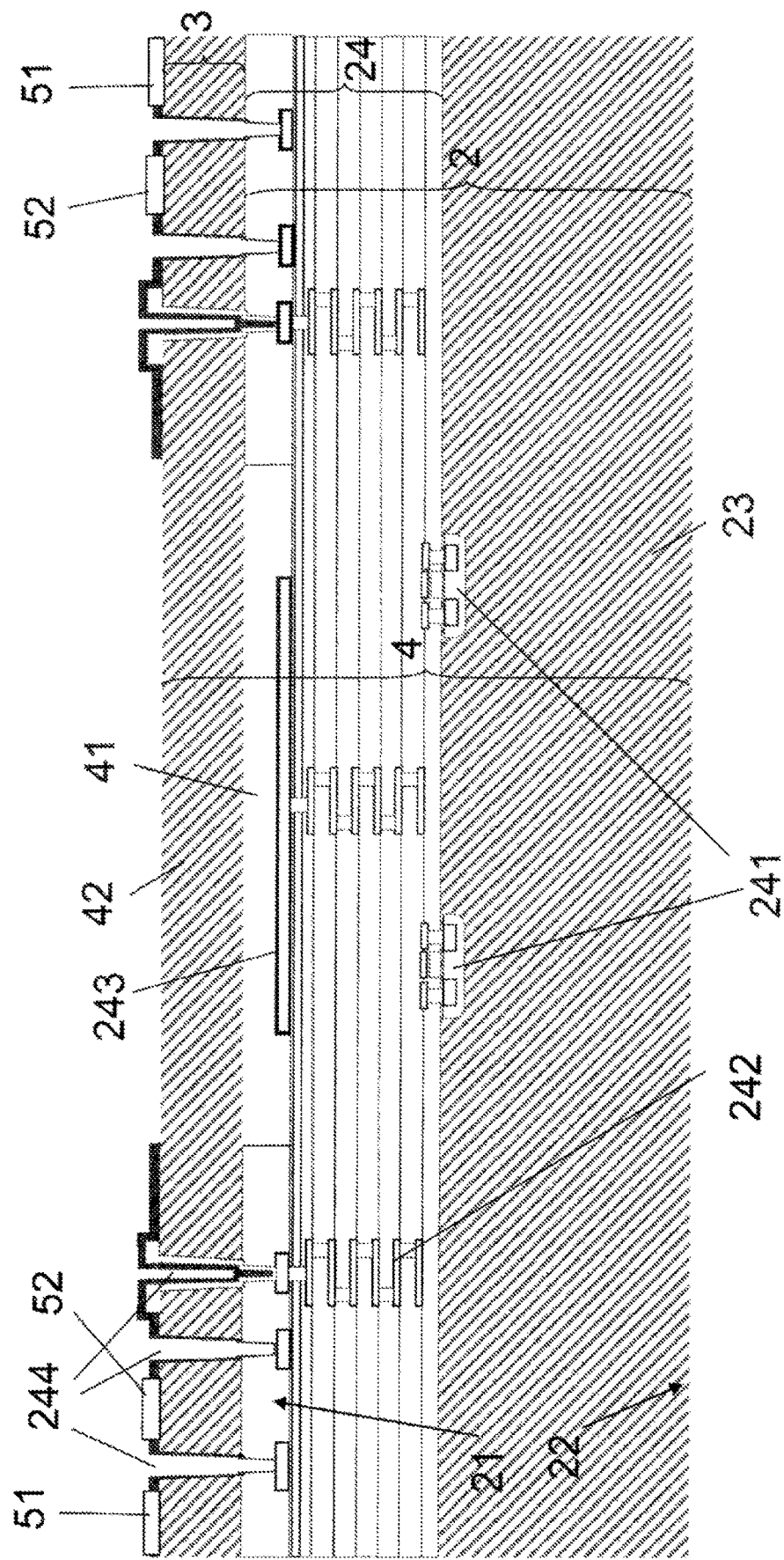
FIG. 2 in its diagrams a) to d) schematic cross-sections of a pressure sensor according an embodiment during processing thereby illustrating processing steps of a method according an embodiment.
Figure 2:
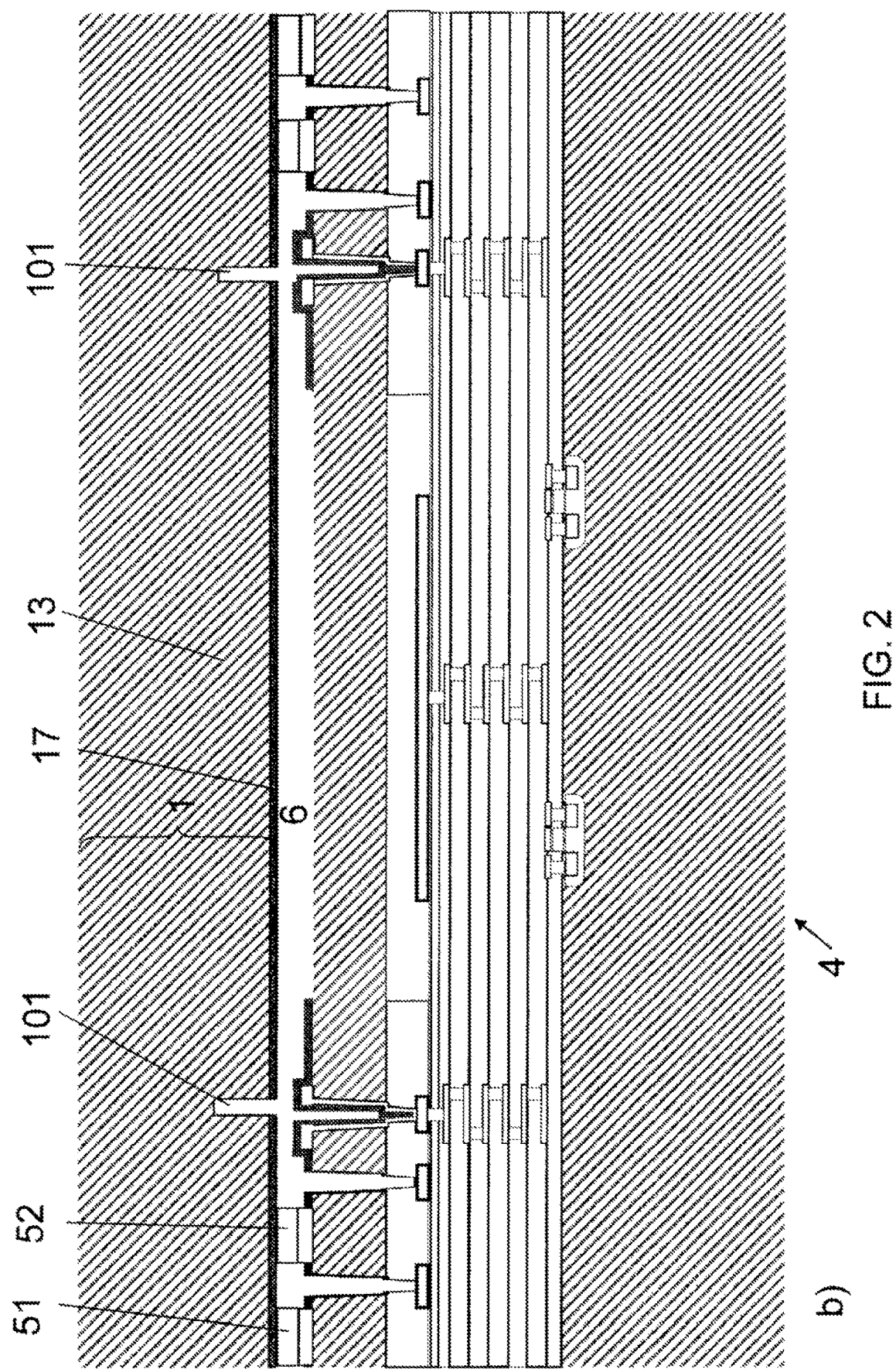
Figure 2:
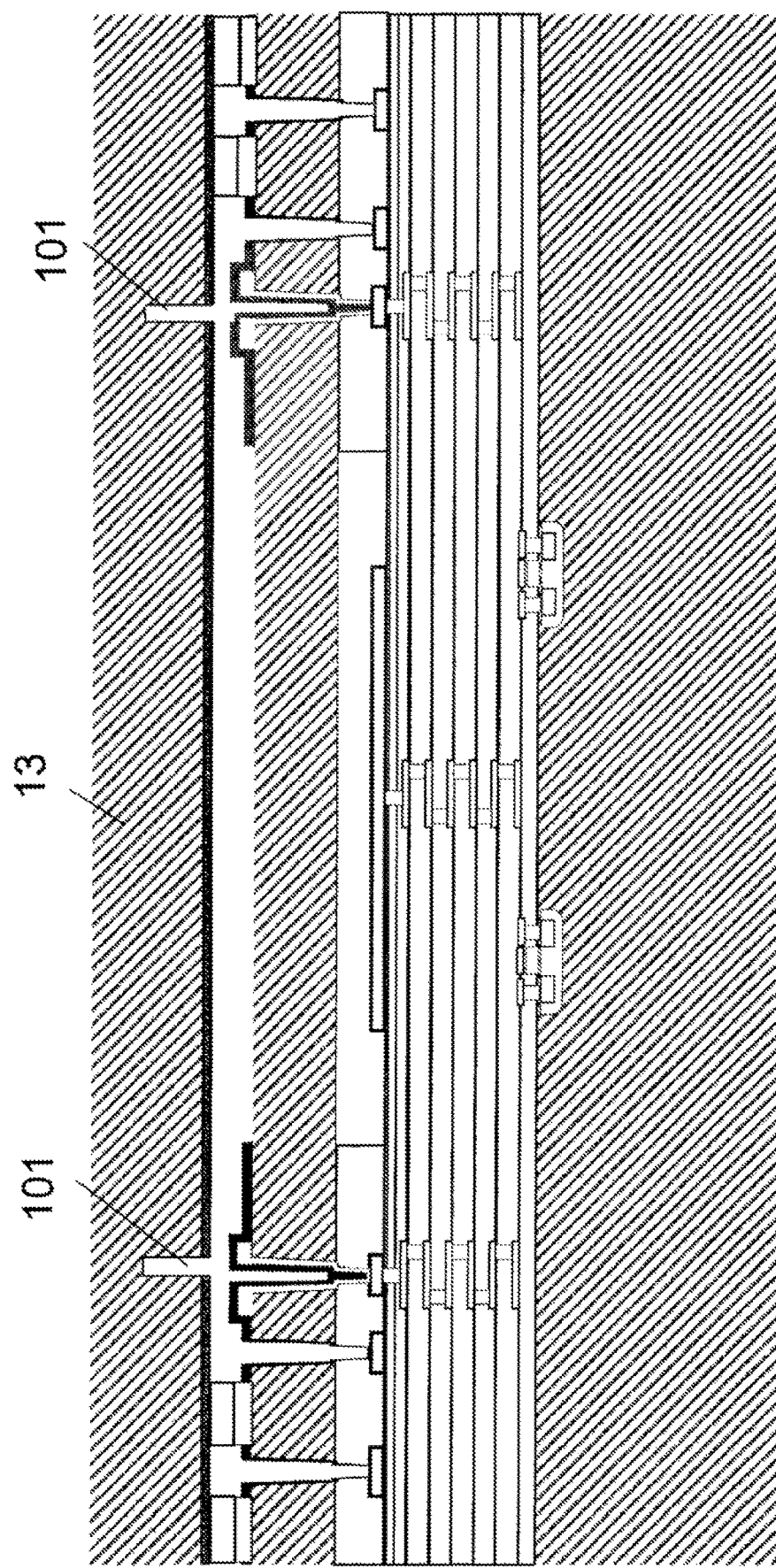
Figure 2:
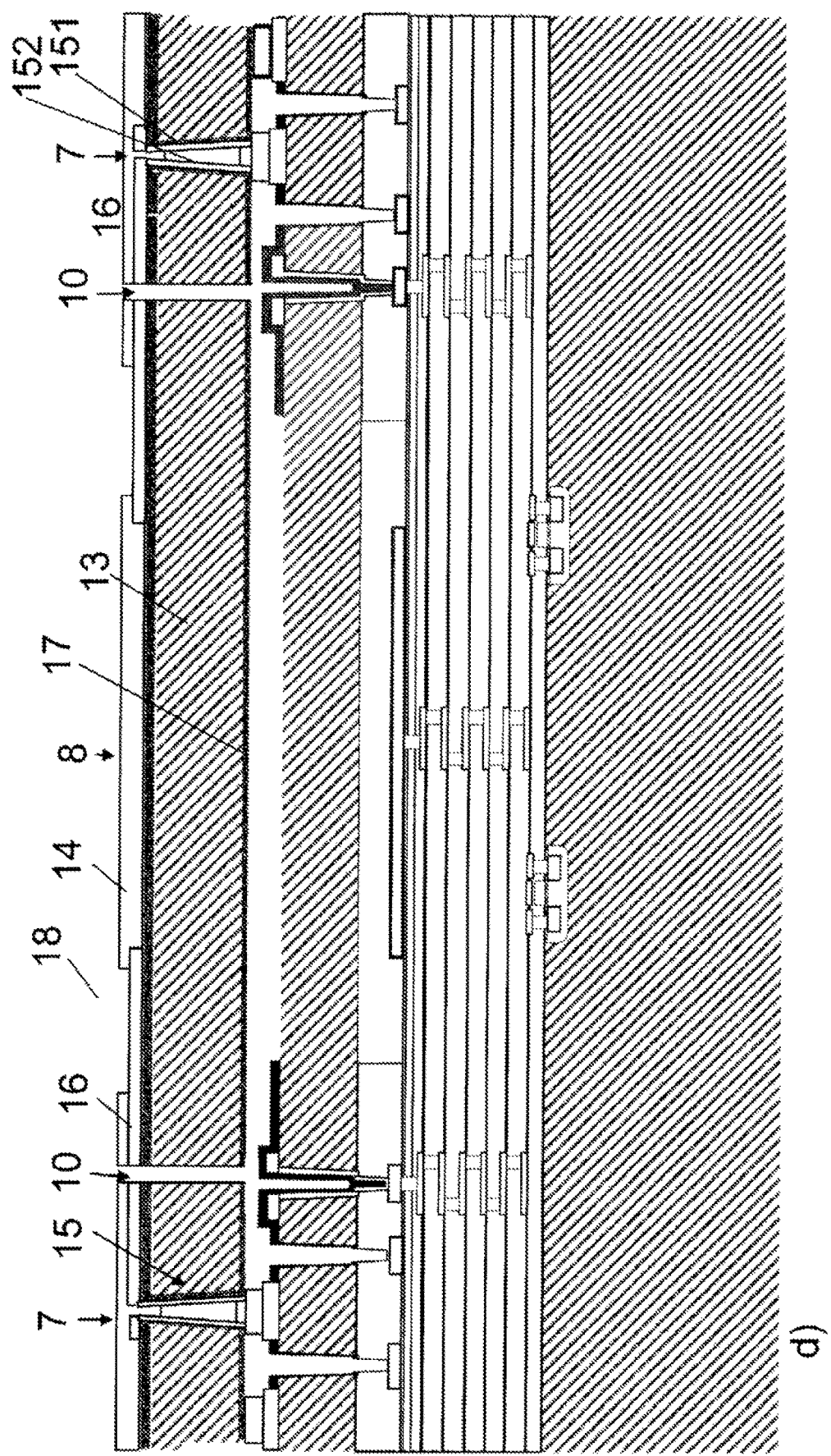

FIG. 2 shows in its diagrams a) to d) schematic cross-sections of a pressure sensor according an embodiment during manufacturing thereby illustrating the individual processing steps. In FIG. 2a) a preprocessed second substrate 2 is shown with a front side 21 and a back side 22 including a bulk material 23 and layers 24 stacked on the bulk material 23, which layers 24 are only schematically illustrated and may contain oxide layers, e.g. SiO2, metal layers, and/or polysilicon layers such as layer 243 serving as electrode, and a top layer 246 serving as passivation layer. A processing circuit 241 is integrated into the second substrate 2, e.g. by doping the bulk material 23 and/or by structuring the layer stack 24. In addition, a cavity 41 is etched into the layers 24, and into the top layer 246.

In a next step, the deformable membrane 42 is built on the preprocessed substrate 2. For this purpose, a third substrate 3 in form of an SOI substrate is attached to the layers 24 of the second substrate 2 at its front side 21 e.g. by fusion bonding. The SOI substrate may contain bulk material, an insulation layer in form of a BOX layer, and a silicon layer as device layer. As a result, the cavity 41 is closed. In a further step not explicitly shown in the Figures, the bulk material and the insulation layer of the SOI substrate are removed such that the silicon layer remains as third substrate 3 covering the cavity 41, which silicon layer is thin enough to deflect in response to pressure applied.

In a next step, contact windows 244 are etched through the third substrate 3 into the layers 24 of the second substrate 2. The contact windows 244 are metalized and spacer elements 51 and 52 are applied to the third substrate 3.

Figure 3:
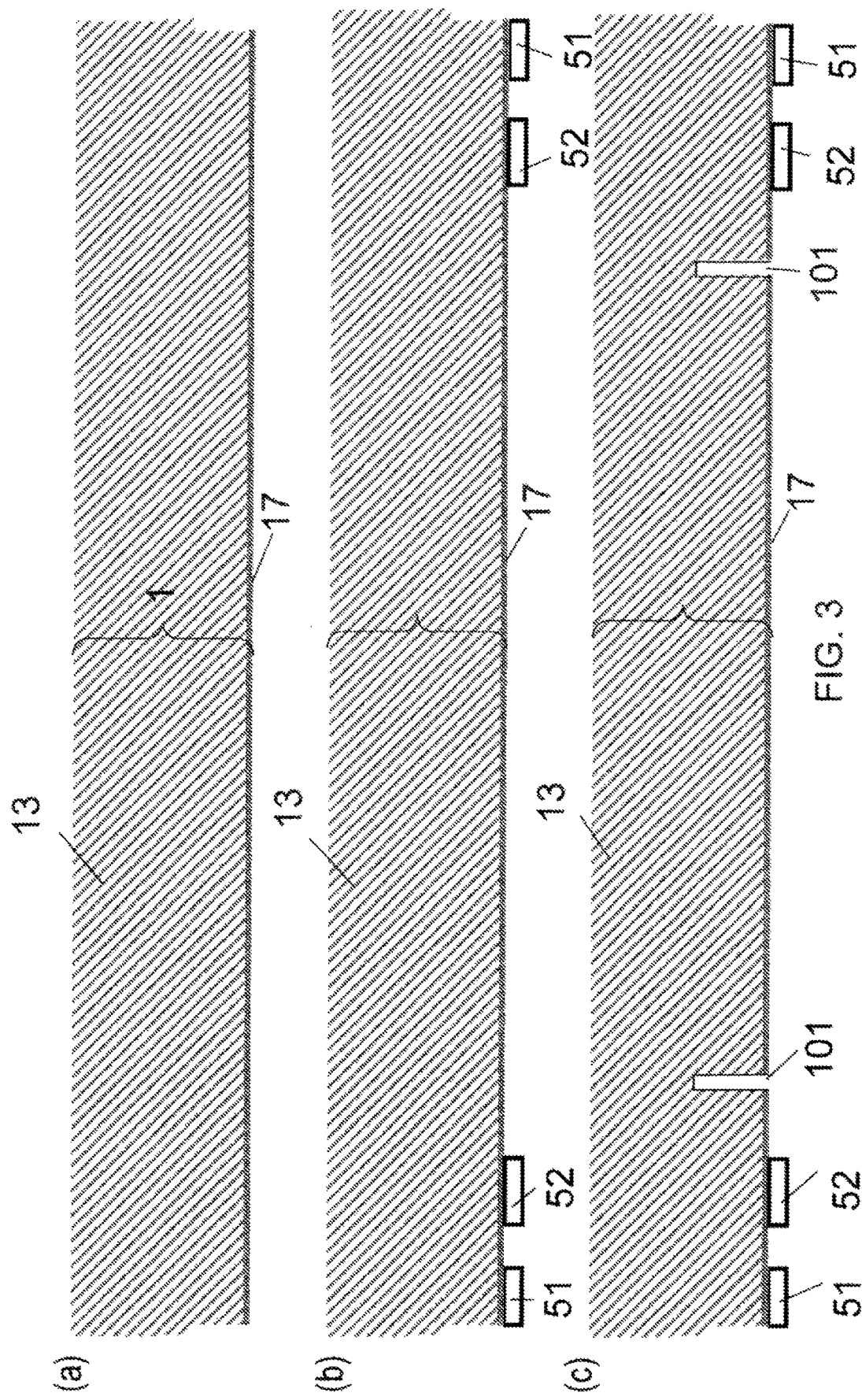
FIG. 3 in its diagrams a) to c) schematic cross-sections of a preprocessing of a first substrate for a pressure sensor according an embodiment.

In a next step illustrated in FIG. 2b), a preprocessed first substrate 1 is attached to the assembly of the second and the third substrate 2, 3. The first substrate 1 is preprocessed, for example, according to the diagrams of FIG. 3.

In the diagram of FIG. 3a) a first substrate 1 is provided, e.g. a semiconductor substrate such as a silicon substrate. At its top side, one or more layers 14 are arranged, such as CMOS layers, or simply an isolation layer such as a silicon-oxide layer. In an additional step shown in FIG. 3b), spacer elements 51 and 52 are arranged at the front side 11 of the first substrate 1. In the step shown in FIG. 3c), trenches 101 are etched into the bulk material 13 of the first substrate thereby penetrating the layers 14, e.g. by deep reactive ion etching.

The first substrate 1 preprocessed according to FIG. 3c) then is applied to the assembly of the pre-processed second and third substrate 2, 3 according to FIG. 2a) thereby resulting in an assembly according to FIG. 2b).

In a next step as illustrated in FIG. 2c), the first substrate 1 is thinned from its backside 11 to a reduced thickness in the range of e.g. 100 to 200 microns. This process can be performed using grinding, etching or milling.

In the step illustrated in FIG. 2d), the first substrate 1 is continued to be processed: Vias 15 are manufactured through the first substrate 1. In a step following the manufacturing of the vias 15, the trenches 101 in the first substrate 1 are opened from the backside 12 of the first substrate 1, e.g. by way of etching such that one or more grooves 10 are now provided reaching through the first substrate 1. In a last step, solder balls 18 or other contact structures may be attached to the backside 12 of the first substrate 1. The result is shown in FIG. 1.

By having manufactured the one or more grooves 10, the first substrate 1 is separated into a support portion 7 to which the cap 4 is attached, and a contact portion 8 via which the pressure sensor is electrically connected to another device.

It should be noted, that the embodiments where the sensing element is a capacitive sensor as described are not limited thereto. Rather, it can be used with any type of pressure sensors that uses a deformable membrane in order to measure a quantity dependent on the pressure drop over the same. In particular, the embodiment can also be used for sensors where the deformation of the membrane is measured by piezoresistive means.

It should further be noted that in any removal of material during manufacturing, the corresponding structures may be created using a chemical (wet) etching process, plasma etching process, laser cutting, mechanical milling or a combination of any of these processes, where suitable.

While above there are shown and described embodiments, it is to be understood that the embodiment is not limited thereto but may be otherwise variously embodied and practiced within the scope of the following claims.

The invention claimed is:

1. A pressure sensor comprising:
a first substrate comprising a cavity, a deformable membrane, a first electrode, and a second electrode, wherein the deformable membrane is formed at one side of the cavity and wherein the first electrode is formed at an opposite side of the cavity facing the deformable membrane, wherein the first electrode is separated from the deformable membrane through the cavity, and wherein the deformable membrane forms the second electrode; and
a second substrate attached to the first substrate and forming a gap with the deformable membrane, wherein the deformable membrane deforms responsive to pressure and wherein the first and the second electrodes generate a signal in response to deformation by the deformable membrane.

2. The pressure sensor of claim 1, wherein the second substrate comprises a support portion and contact portion, wherein the support portion is configured to attach to the second substrate, and wherein the contact portion is configured to provide electrical connection to a device external to the pressure sensor.

3. The pressure sensor of claim 2 further comprising grooves formed within the second substrate, wherein the grooves separate the support portion from the contact portion.

4. The pressure sensor of claim 1 further comprising:
a spacer element configured to separate the first substrate from the second substrate and to form the gap therein.

5. The pressure sensor of claim 4, wherein the spacer element comprises a mechanical spacer that provides mechanical stability, and wherein the spacer element further comprises an electrical spacer that provides electrical connection between the first substrate and the second substrate.

6. The pressure sensor of claim 1, wherein the second substrate further comprises a port exposing the deformable membrane.

7. A pressure sensor comprising:
a first substrate comprising a deformable membrane and a first electrode;
a second substrate comprising a second electrode; and
a dielectric layer disposed between the first and the second substrates,
wherein the second substrate is attached to the first substrate through the dielectric layer to form a cavity therein, and wherein the deformable membrane is formed at one side of the cavity,
wherein the second electrode is formed at an opposite side of the cavity facing the deformable membrane, wherein the second electrode is separated from the deformable membrane through the cavity, and wherein the first electrode is formed on the deformable membrane,
and wherein the deformable membrane deforms responsive to pressure and wherein the first and the second electrodes generate a signal in response to deformation by the deformable membrane.

8. The pressure sensor of claim 7, wherein the dielectric layer is a selected from a group consisting of silicon oxide and silicon nitride.

9. The pressure sensor of claim 7, wherein the dielectric layer protects structures disposed between the first substrate and the second substrate.

10. The pressure sensor of claim 7 further comprising:
a plurality of layers disposed under the dielectric layer and formed within the second substrate, wherein the plurality of layers is configured for CMOS processing.

11. The pressure sensor of claim 7, wherein the first and the second electrodes form a capacitor.

12. The pressure sensor of claim 7 wherein the second substrate comprises electronic circuit.

13. The pressure sensor of claim 7 further comprising:
wire bonds coupled to the first substrate, wherein the wire bonds are configured to electrically connect to an external device.

14. The pressure sensor of claim 7 further comprising:
a plurality of contact windows in the dielectric layer.

15. The pressure sensor of claim 14 further comprising a conductive layer lining a via in the first substrate to provide electrical connection from the second substrate to a spacer element.

16. The pressure sensor of claim 15 further comprising wire bonds coupled to the spacer, wherein the wire bonds are configured to electrically connect to an external device.

17. The pressure sensor of claim 7, where in the deformable membrane is exposed to an environment of the sensor.

18. The pressure sensor of claim 7, where in the deformable membrane comprises silicon.

19. The pressure sensor of claim 7, where in the first substrate is attached to the dielectric layer by a fusion bond.

20. The pressure sensor of claim 7, where in the second substrate comprises a plurality of SiO2 layers, metal or polysilicon layers.

\* \* \* \* \*